(12) United States Patent
Xu et al.

(10) Patent No.: US 10,076,772 B2
(45) Date of Patent: Sep. 18, 2018

(54) TRANSDUCER AND METHOD FOR FORMING THE SAME

(71) Applicant: Agency for Science, Technology and Research, Singapore (SG)

(72) Inventors: Jinghui Xu, Singapore (SG); Hongbin Yu, Singapore (SG); Liang Lou, Singapore (SG); Alex Yuandong Gu, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 754 days.

(21) Appl. No.: 14/553,023

(22) Filed: Nov. 25, 2014

(65) Prior Publication Data
US 2015/0145374 A1 May 28, 2015

(30) Foreign Application Priority Data
Nov. 26, 2013 (SG) ................. 201308751-5

(51) Int. Cl.
| | |
|---|---|
| *B06B 1/06* | (2006.01) |
| *H01L 41/053* | (2006.01) |
| *H01L 41/09* | (2006.01) |
| *H01L 41/113* | (2006.01) |
| *G10K 9/122* | (2006.01) |

(52) U.S. Cl.
CPC .......... *B06B 1/0644* (2013.01); *B06B 1/0651* (2013.01); *G10K 9/122* (2013.01); *H01L 41/053* (2013.01); *H01L 41/0973* (2013.01); *H01L 41/1138* (2013.01); *Y10T 29/42* (2015.01)

(58) Field of Classification Search
CPC .... B06B 1/0644; B06B 1/0651; G10K 9/122; H01L 41/053; H01L 41/0973; H01L 41/1138
USPC ................ 310/324, 330, 331, 332, 334, 337
See application file for complete search history.

(56) References Cited

U.S. PATENT DOCUMENTS

| | | | |
|---|---|---|---|
| 5,313,836 A | 5/1994 | Fujii et al. | |
| 5,361,243 A * | 11/1994 | Kasahara | G11B 7/08582 267/161 |
| 6,396,196 B1 * | 5/2002 | Takeuchi | B32B 18/00 310/324 |
| 8,717,121 B2 | 5/2014 | Kawai et al. | |
| 8,819,912 B2 * | 9/2014 | Browne | B23K 37/04 29/428 |
| 2004/0075364 A1 * | 4/2004 | Mehta | H01G 5/18 310/324 |
| 2005/0162040 A1 * | 7/2005 | Robert | H03H 9/172 310/322 |
| 2006/0024880 A1 * | 2/2006 | Chui | B81B 3/001 438/222 |
| 2008/0278035 A1 * | 11/2008 | Higashionji | H02N 2/026 310/330 |

(Continued)

*Primary Examiner* — Bryan Gordon
(74) *Attorney, Agent, or Firm* — K. David Crockett, Esq.; Niky Economy Syrengelas, Esq.; Crockett & Crockett, PC

(57) ABSTRACT

A transducer is provided, which includes a substrate, wherein a cavity is defined at least partially through the substrate, at least one stopper structure arranged within the cavity, a support layer arranged over the at least one stopper structure and the cavity to seal the cavity, and a piezoelectric functional arrangement arranged on the support layer. According to further embodiments of the present invention, a method for forming a transducer is also provided.

17 Claims, 11 Drawing Sheets

(56) References Cited

U.S. PATENT DOCUMENTS

| | | | |
|---|---|---|---|
| 2009/0174014 A1* | 7/2009 | Kunze | B81B 3/0024 |
| | | | 257/415 |
| 2010/0207484 A1* | 8/2010 | Chang | B06B 1/0292 |
| | | | 310/300 |
| 2011/0148255 A1* | 6/2011 | Nihei | H01H 57/00 |
| | | | 310/330 |
| 2012/0068690 A1* | 3/2012 | Song | G01N 29/022 |
| | | | 324/76.39 |
| 2012/0205173 A1* | 8/2012 | Mallette | B62M 27/02 |
| | | | 180/193 |
| 2013/0081464 A1 | 4/2013 | Park et al. | |
| 2013/0293065 A1* | 11/2013 | Hajati | B06B 1/0629 |
| | | | 310/334 |

\* cited by examiner

TRANSDUCER AND METHOD FOR FORMING THE SAME

CROSS-REFERENCE TO RELATED APPLICATION

This application claims the benefit of priority of SG application No. 201308751-5, filed Nov. 26, 2013, the contents of which are incorporated herein by reference for all purposes.

TECHNICAL FIELD

Various embodiments relate to a transducer and a method for forming the transducer.

BACKGROUND

An acoustic transducer is a device to generate or detect an acoustic signal which travels in a media, and is a critical component in an offshore exploring system (hydrophone) and micro-machined ultrasonic transducers (pMUT and cMUT). An acoustic transducer must have a good frequency response performance and a low noise performance. Furthermore, an offshore exploring system requires the embedded hydrophone to have a large storage depth, normally >200 m to prevent the device from breaking if the system goes into deep water accidentally. Also, this membrane based acoustic transducer must survive shock vibration.

However, conventional transducers have a small storage depth (normally <50 m) without a rigid package. Therefore, a special package is needed so as to achieve a large storage depth. Furthermore, conventional transducers will break once the transducers suffer from shock vibration.

SUMMARY

According to an embodiment, a transducer is provided. The transducer may include a substrate, wherein a cavity is defined at least partially through the substrate, at least one stopper structure arranged within the cavity, a support layer arranged over the at least one stopper structure and the cavity to seal the cavity, and a piezoelectric functional arrangement arranged on the support layer.

According to an embodiment, a method for forming a transducer is provided. The method may include forming a cavity at least partially through a substrate, forming at least one stopper structure within the cavity, forming a support layer over the at least one stopper structure and the cavity to seal the cavity, and forming a piezoelectric functional arrangement on the support layer.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 2A shows a schematic perspective view of a transducer, with a section cut away, while

DETAILED DESCRIPTION

Figure 1A:
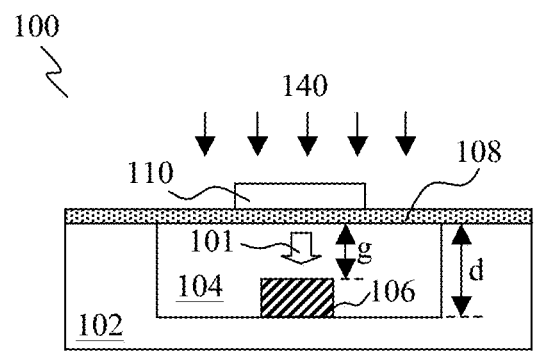
FIG. 1A shows a schematic cross-sectional view of a transducer, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may relate to Micro-Electro-Mechanical System (MEMS) technology, for example, relating to an acoustic transducer (e.g., a piezoelectric MEMS acoustic transducer). Various embodiments may provide an improvement in the performance and robustness of the transducer using a vacuum sealed backside cavity and at least one stopper structure inside the cavity.

Various embodiments may provide a piezoelectric MEMS (micro-electro-mechanical system) transducer with one or more stopper structures.

Various embodiments may provide a high performance piezoelectric MEMS acoustic transducer which may address or overcome the issues of conventional transducers mentioned above. Various embodiments may provide a structure design for a piezoelectric MEMS acoustic transducer. The transducer of various embodiments may include a vacuum sealed cavity (e.g., a vacuum sealed backside cavity) which may be used to keep or maintain a low and stable Brownian noise level (and/or acoustic impedance), thus improving the signal noise ratio (SNR), a corresponding stopper structure design inside the (backside) cavity may be used to keep the membrane based transducer safe once or if the device suffers from shock vibration and/or deep water hydrostatic pressure. The stopper design, having one or more stopper structures, may act as a protection structure or a support structure when the transducer goes into deep water or suffers from shock vibration.

Various embodiments may provide a high performance piezoelectric MEMS acoustic transducer. The transducer may include or consists of a vacuum sealed backside cavity to keep or maintain a stable, low acoustic impedance and Brownian noise, one or more stopper structures sitting on or within the cavity for a) shock vibration/deep water protection, and having b) a deep cavity design, which may significantly reduce the Brownian noise; and a $SiO_2/Si/SiO_2$ (silicon oxide/silicon/silicon oxide) support layer, which may be adopted to maximize the output charge while stabilizing the low frequency response by raising its natural resonant frequency. The support layer may act as a membrane. In addition, a top oxide (e.g., silicon oxide) may be provided, which may also serve as a dielectric layer to minimise or avoid charge leakage. Simulation results of the transducer of various embodiments indicate that the stopper structure may efficiently protect the transducer's membrane from shock vibration and/or deep water hydrostatic pressure, which may significantly improve the transducer's robustness and lifetime. The transducer of various embodiments may have a wide application prospect in, for example, seafloor resource detection and ultrasonic medical devices.

Without a special (rigid and acoustic transparent) package, a conventional transducer membrane may be exposed directly to fluid (only with some soft coating for electrical protection), thus hydrostatic pressure may cause the transducer membrane to break (or break down) once it goes into deep water (>50 m). Further, huge acceleration from shock vibration may cause the transducer membrane to break. Various embodiments may provide a transducer (e.g., a piezoelectric MEMS acoustic transducer) with a stopper structure and a vacuum sealed cavity. The stopper structure may allow the membrane to touch, but not stick, to the top surface of the stopper (due to a small touching area and a clean vacuum environment), thus protecting the membrane, and therefore the transducer. Furthermore, the stopper design may allow a large cavity depth which may, a) reduce the squeeze film damping coefficient between the transducer membrane and the cavity, thus reducing the Brownian noise significantly; b) relax the requirement of the wafer level vacuum bonding; and/or c) extend the vacuum lifetime due to the large cavity.

FIG. 1A shows a schematic cross-sectional view of a transducer 100, according to various embodiments. The transducer 100 includes a substrate 102, wherein a cavity 104 is defined at least partially through the substrate 102, at least one stopper structure 106 arranged within the cavity 104, a support layer 108 arranged over the at least one stopper structure 106 and the cavity 104 to seal the cavity 104, and a piezoelectric functional arrangement 110 arranged on the support layer 108.

In other words, a transducer 100 may be provided. The transducer 100 may have a substrate (or carrier) 102 with a cavity 104 defined at least partially through a thickness of the substrate 102. The cavity 104 may be formed as a recess or a void at least partially into the substrate 102. The transducer 100 may further include at least one (e.g., one or more) stopper structure 106 formed within or inside the cavity 104. As a non-limiting example, a top surface of the at least one stopper structure 106 may be at least substantially flat or planar.

The transducer 100 may further include a support layer 108 formed or arranged over the at least one stopper structure 106 and the cavity 104 to seal the cavity 104. Accordingly, a lower (or bottom) surface of the support layer 108 may form a top surface of the defined (sealed) cavity 104. The lower surface of the support layer 108 may face an interior of the cavity 104. At least a portion of the support layer 108 may be arranged overlapping the at least one stopper structure 106 and the cavity 104.

The cavity 104 may be an enclosed or fully enclosed cavity 104. The cavity 104 may be enclosed by the support layer 108 and the substrate 102. The top surface of the (sealed) cavity 104 may be defined by the bottom surface of the support layer 108, while the sidewalls and the base (or bottom) surface of the (sealed) cavity 104 may be defined by the substrate 102. The cavity 104 may be sealed by the support layer 108 arranged over the cavity 104, for example vacuum sealed.

The transducer 100 may further include a piezoelectric functional arrangement (or piezoelectric functional stack) 110 arranged on the support layer 108. The piezoelectric functional arrangement 110 may be arranged over the cavity 104. This may mean that the piezoelectric functional arrangement 110 may overlap the at least one stopper structure 106 and the cavity 104. The piezoelectric functional arrangement 110 may be employed, for example, for actuation (e.g., for generating an acoustic signal) and/or sensing (e.g., for sensing an acoustic signal).

In various embodiments, the support layer 108 may be arranged in a first layer (or plane), and the piezoelectric functional arrangement 110 may be arranged in a second layer (or plane) adjacent to the first layer. This may mean that the support layer 108 and the piezoelectric functional arrangement 110 may be arranged in separate layers or planes.

In various embodiments, the support layer 108 may define a membrane of the transducer 100. For example, the support layer 108 may define a thin film membrane structure.

In various embodiments, the piezoelectric functional arrangement (or piezoelectric functional stack) 110 may receive and/or transmit an acoustic signal, as represented by arrows 140. The piezoelectric functional arrangement 110 may react in response to the acoustic signal 140, for example, the piezoelectric functional arrangement 110 may generate an electrical signal in response to the acoustic signal 140 incident on the piezoelectric functional arrangement 110, which may cause mechanical stress to the piezoelectric functional arrangement 110. The converse may also be applicable, in that an electrical signal applied to the piezoelectric functional arrangement 110 may result in a mechanical stress or reaction of the piezoelectric functional arrangement 100, which in turn may generate an acoustic signal.

In various embodiments, the support layer 108 may transmit and/or receive an acoustic signal 140.

In various embodiments, the support layer 108 may be movable or may deform, from its equilibrium position or state as shown in FIG. 1A, for example, in response to a force or pressure applied to the support layer 108 or to the transducer 100. For example, the support layer 108 may be movable or deform towards the cavity 104, meaning in a direction, as represented by the arrow 101, into the cavity 104. In various embodiments, the at least one stopper structure 106, being arranged in the cavity 104, may come into contact with the support layer 108 when the support layer 108 deforms sufficiently into the cavity 104. In this way, the at least one stopper structure 106 may act to stop further movement or deformation of the support layer 108 into the cavity 104. Accordingly, the at least one stopper structure 106 may act as support (e.g., as a support structure) for the support layer 108, for example, when a force or pressure is exerted on the support layer 108 or to the transducer 100. This may prevent the support layer 108 from breaking or breaking down.

In various embodiments, the support layer 108 may be arranged directly on the substrate 102. This may mean that the support layer 108 may directly contact the substrate 102. As a non-limiting example, for example, the support layer 108 may be bonded (e.g., by means of fusion bonding) to the substrate 102.

In various embodiments, the piezoelectric functional arrangement 110 may be arranged directly on the support layer 108. This may mean that the piezoelectric functional arrangement 110 may directly contact the support layer 108.

In various embodiments, the at least one stopper structure 106 may extend from a base surface of the cavity 104. For example, the at least one stopper structure 106 may extend at least substantially vertically or perpendicularly from the base surface of the cavity 104.

In various embodiments, the at least one stopper structure 106 may include or may be an elongate structure. For example, the at least one stopper structure 106 may be a pillar, a column, a rod or any other types of elongate structure.

In various embodiments, the at least one stopper structure 106 may have a cylindrical structure or a cylindrical base.

In various embodiments, the at least one stopper structure 106 may have a cross-sectional shape of a circle, a ring, a square, a pentagon or a hexagon. However, it should be appreciated that any cross-sectional shape may be employed.

In various embodiments, the at least one stopper structure 106 may include or may be a ring structure.

In various embodiments, the at least one stopper structure 106 may include a tapered top region. The tapered top region may have a flat surface or may have a tip, e.g., the tapered top region may have a cone shape.

In various embodiments, the at least one stopper structure 106 may include a polymer coated top surface. For example, the polymer may include hydrocarbon chlorosilane-based self-assembled monolayers (SAM) or fluorocarbon chlorosilane-based self-assembled monolayers (SAM).

In various embodiments, the material of the at least one stopper structure 106 may be the same as the material of the substrate 102.

In various embodiments, the transducer 100 may include a plurality (or an array) of stopper structures 106 arranged within (or inside) the cavity 104. The plurality of stopper structures 106 may be of at least substantially similar or identical height (or thickness). The plurality of stopper structures 106 may extend from a base surface of the cavity 104.

The plurality of stopper structures 106 may be arranged in at least one concentric pattern. In various embodiments, the plurality of stopper structures 106 may be arranged in a plurality of concentric patterns. In various embodiments, the plurality of stopper structures 106 may include or may be concentric rings.

In various embodiments, adjacent stopper structures 106 of the plurality of stopper structures 106 may be arranged spaced apart from each other.

It should be appreciated that each stopper structure 106 may be of any suitable structure, which may be arranged inside the cavity 104 and which may provide support to the support layer 108 when the support layer 108 deforms into the cavity 104 in response to an applied force.

In various embodiments, the support layer 108 may include a semiconductor layer and an insulating layer arranged one over the other. The insulating layer may be arranged proximal to the cavity 104 and/or the substrate 102. In various embodiments, the support layer 108 may further include an additional insulating layer, wherein the semiconductor layer may be arranged in between (or sandwiched between) the insulating layer and the additional insulating layer.

In the context of various embodiments, the semiconductor layer of the support layer 108 may include silicon (Si), poly-silicon, silicon oxide ($SiO_2$), silicon carbide (SiC) or any other suitable materials.

In the context of various embodiments, at least one of the insulating layer or the additional insulating layer of the support layer 108 may include silicon oxide ($SiO_2$) or silicon nitride ($SiN_x$), or aluminium nitride (AlN) or any other suitable materials.

In the context of various embodiments, at least one of the insulating layer or the additional insulating layer of the support layer 108 may include an oxide.

In various embodiments, the support layer 108 may include an arrangement of $SiO_2/Si/SiO_2$.

In various embodiments, the piezoelectric functional arrangement 110 may include a pair of electrodes (e.g., a top electrode and a bottom electrode) and a piezoelectric element arranged in between (or sandwiched between) the pair of electrodes. In this way, the piezoelectric functional arrangement 110 may include an electrode/piezoelectric/ electrode functional (e.g., sensing and/or actuating) layer or functional (e.g., sensing and/or actuating) arrangement. Therefore, the piezoelectric functional arrangement 110 may have a stack structure or stack arrangement of a bottom electrode, a piezoelectric element, and a top electrode. The piezoelectric element may be or may function as a piezoelectric sensing layer (or actuating layer). In various embodiments, the entire piezoelectric element may be arranged overlapping the cavity 104.

In the context of various embodiments, the piezoelectric element of the piezoelectric functional arrangement 110 may include or may be aluminum nitride (AlN), quartz, lithium niobate (LiNbO$_3$), or lithium tantalate (LiTaO$_3$). However, it should be appreciated that any other suitable piezoelectric material may be employed, including but not limited to, zinc oxide (ZnO), cadmium sulfide (CdS), lead titanate (PbTiO$_3$), lead zirconate titanate (PZT), potassium niobate (KNbO$_3$), lithium borate (Li$_2$B$_4$O$_7$), langasite (La$_3$Ga$_5$SiO$_{14}$), gallium arsenside (GaAs), barium sodium niobate, bismuth germanium oxide (BGO), indium arsenide (InAs), and indium antimonide (InSb).

In various embodiments, each electrode of the pair of electrodes of the piezoelectric functional arrangement 110 may include a metal, for example, molybdenum (Mo), aluminium (Al), platinum (Pt), gold (Au), copper (Cu), or any other suitable materials.

In various embodiments, the transducer 100 may further include electrical interconnections (e.g., aluminium (Al) interconnections) electrically coupled to the pair of electrodes of the piezoelectric functional arrangement 110.

In various embodiments, the transducer 100 may further include a piezoelectric seed layer arranged between the piezoelectric functional arrangement 110 and the support layer 108. The piezoelectric seed layer may assist or promote the formation of the piezoelectric functional arrangement 110 on the support layer 108. The piezoelectric seed layer may enhance the adhesion of the piezoelectric functional arrangement 110 on the support layer 108. In various embodiments, the piezoelectric seed layer may include a material that is the same as the material of the piezoelectric element of the piezoelectric functional arrangement 110.

In various embodiments, the transducer 100 may further include an ultrasound frequency signal generating circuit electrically coupled to the piezoelectric functional arrangement 110. The ultrasound frequency signal generating circuit may be electrically coupled to the pair of electrodes of the piezoelectric functional arrangement 110. The ultrasound frequency signal generating circuit may generate and apply an electrical signal (for example, having a frequency in the ultrasound region) to the piezoelectric functional arrangement 110 for actuating the piezoelectric functional arrangement 110 or the piezoelectric element of the piezoelectric functional arrangement 110. As a result, an acoustic signal may be generated from the piezoelectric functional arrangement 110.

In various embodiments, the transducer 100 may further include an acoustic signal detector. The acoustic signal detector may be a wideband acoustic signal detector, for example, for the infrasonic, audio and ultrasonic ranges.

In the context of various embodiments, a depth, d, of the cavity 104 may be larger than about 1 μm (e.g., >1 μm), for example, >1.2 μm, >1.5 μm, >2 μm, >5 μm, >10 μm. However, it should be appreciated that any other larger depths may also be employed. The term "depth" here refers to the distance from the base surface of the cavity 104 to the top of the cavity 104 (or to the bottom surface of the support layer 108).

In the context of various embodiments, in an equilibrium position, a distance, g, between a top surface of the at least one stopper structure 106 and a lower surface of the support layer 108 may be between about 0.2 μm and about 10 μm, for example, between about 0.2 μm and about 5 μm, between about 0.2 μm and about 2 μm, between about 2 μm and about 10 μm, between about 5 μm and about 10 μm, or between about 3 μm and about 6 μm. The top surface of the at least one stopper structure 106 and the lower surface of the support layer 108 may be facing each other.

In the context of various embodiments, the cavity 104 may be at least substantially vacuum sealed. This may mean that an interior of the cavity 104 may be a vacuum, such that the cavity 104 may be a vacuum sealed cavity 104. The vacuum sealed cavity 104 may be at least substantially devoid of air.

In the context of various embodiments, the substrate 102 may include or may be a semiconductor substrate. For example, the substrate 102 is a silicon (Si) substrate.

In the context of various embodiments, the transducer 100 may be a piezoelectric based acoustic transducer, for example, for sensing purposes, such as sensing an acoustic signal.

In the context of various embodiments, the transducer 100 may be a piezoelectric MEMS (micro-electro-mechanical systems) transducer, e.g., a piezoelectric MEMS acoustic transducer.

In the context of various embodiments, the transducer 100 may be a hydrophone.

Figure 1B:
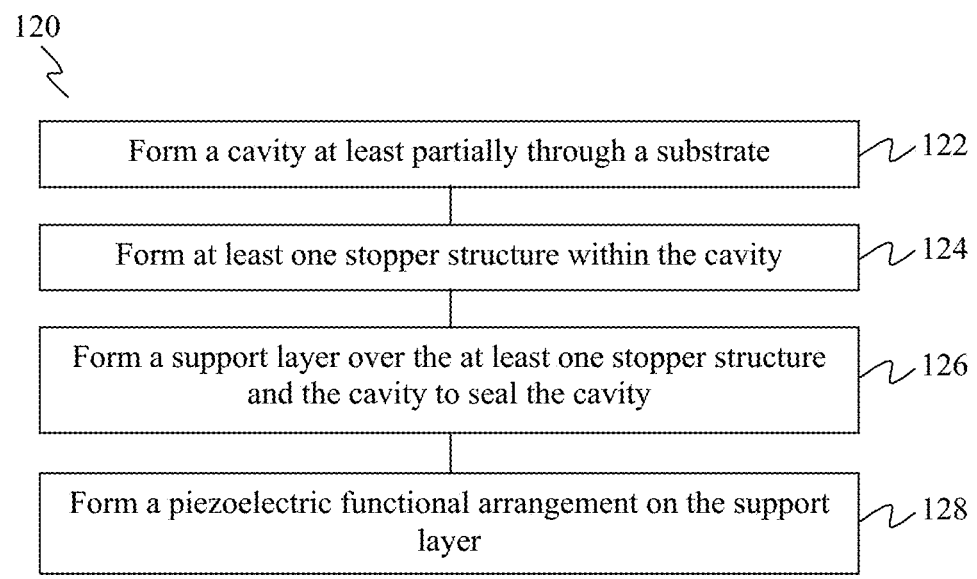
FIG. 1B shows a flow chart illustrating a method for forming a transducer, according to various embodiments.

FIG. 1B shows a flow chart 120 illustrating a method for forming a transducer, according to various embodiments.

At 122, a cavity is formed at least partially through a substrate.

At 124, at least one stopper structure is formed within the cavity.

At 126, a support layer is formed over the at least one stopper structure and the cavity to seal the cavity.

At 128, a piezoelectric functional arrangement is formed on the support layer.

It should be appreciated that descriptions in the context of the transducer 100 may correspondingly be applicable in relation to the method for forming a transducer.

Figure 2A:
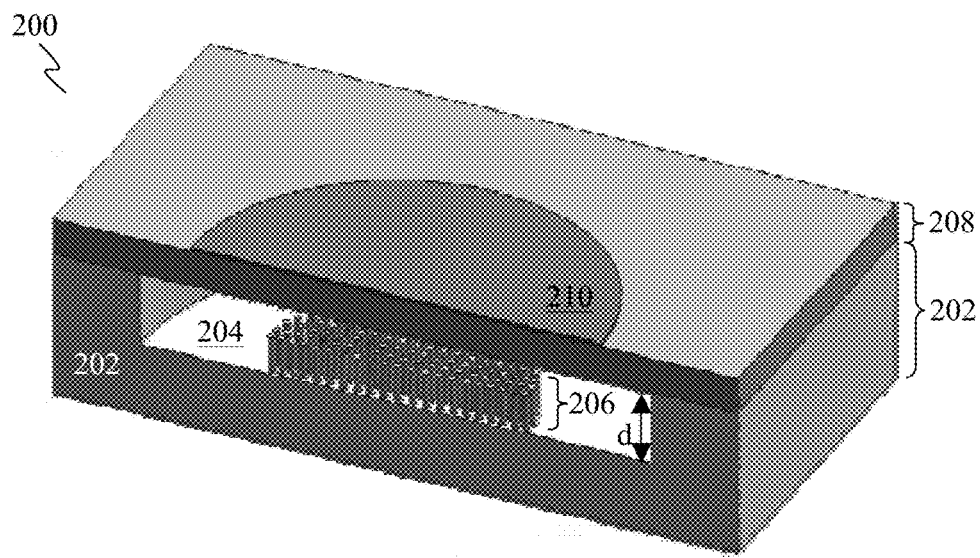
Figure 2B:
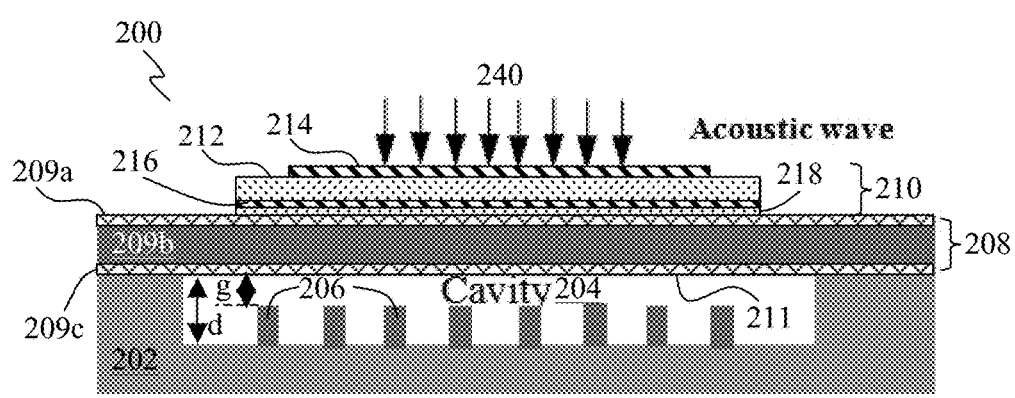
FIG. 2B shows schematic cross-sectional view of the transducer, according to various embodiments.
Figure 2C:
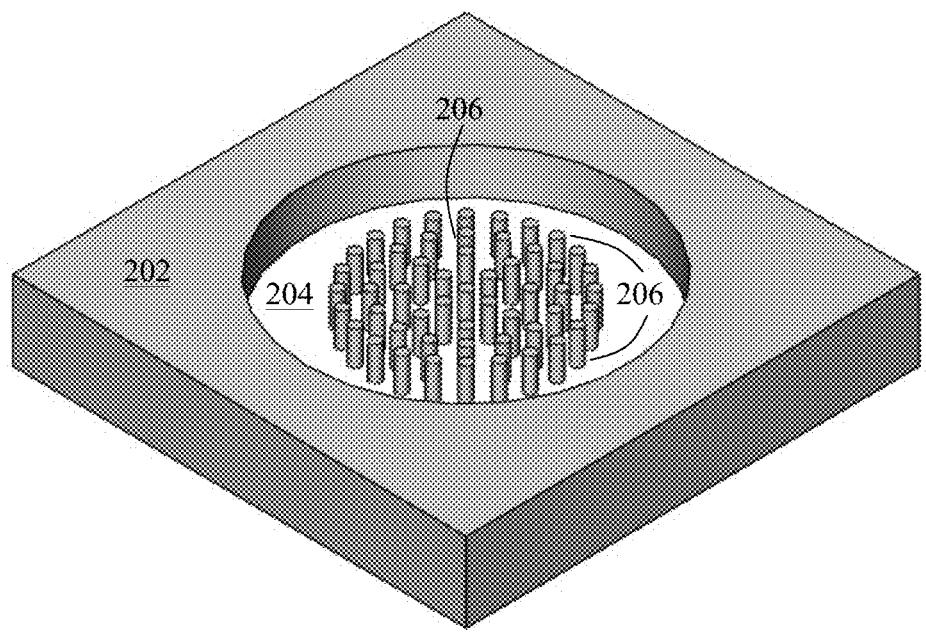
FIG. 2C shows a schematic perspective view of a substrate of a transducer, according to various embodiments.

FIG. 2A shows a schematic perspective view of a transducer 200, with a section cut away to show its interior, while FIG. 2B shows a schematic cross-sectional view of the transducer 200 or one cell thereof, according to various embodiments. The transducer 200 maybe a hydrophone. FIG. 2C shows a schematic perspective view of a substrate 202 of a transducer (e.g., 200), according to various embodiments.

FIG. 2A illustrates a simplified 3D (three-dimensional) model of the sensing structure of the transducer 200, which may include a vacuum sealed backside cavity 204 defined in a substrate (or support substrate, or carrier) 202, at least partially through the thickness or height of the substrate 202, and an arrangement (or plurality) of stopper structures 206 inside the cavity 204.

Referring to FIGS. 2A and 2B, the cavity 204 may have a depth, d. In various embodiments, the stopper structures 206 may have at least substantially similar or identical heights. The stopper structures 206 may be individual structures and may be arranged spaced apart from each other. Each stopper structure 206 may be in the form of a pillar, for example. In various embodiments, the substrate 202 may be a silicon (Si) substrate and the stopper structures 206 may include silicon (Si).

The transducer 200 may also include a support layer 208, for example having an arrangement of $SiO_2$ (silicon oxide) 209a/Si (silicon) 209b/$SiO_2$ (silicon oxide) 209c layers. The support layer 208 may be arranged in contact with the substrate 202. A portion of the support layer 208 may be arranged overlapping with the cavity 204. In the equilibrium position of the support layer 208, a distance or gap, g, may be provided between the stopper structures 206 and the bottom (or lower) surface 211 of the support layer 208.

The support layer 208 may be or act as a membrane or diaphragm. At least part of the support layer 208 may be movable, e.g., a portion of the support layer 208 overlapping with the cavity 204 may be movable. The support layer 208 may be movable along an out-of-plane direction, into and/or away from the cavity 204.

The transducer 200 may further include a piezoelectric functional arrangement (or piezoelectric functional stack) 210. The piezoelectric functional arrangement 210 may be arranged in contact with the support layer 208. The piezoelectric functional arrangement 210 may include a piezoelectric sensing (or actuating) layer 212 sandwiched between a pair of electrodes of a top (or upper) electrode 214 and a bottom (or lower) electrode 216. In various embodiments, there may be another piezoelectric layer 218 in between the bottom electrode 216 and the support layer 208, where the piezoelectric layer 218 may act as a seed layer. As a non-limiting example, at least one of the piezoelectric layers 212, 218 may include aluminium nitride (AlN). In various embodiments, the piezoelectric functional arrangement 210 may receive an acoustic wave (e.g., sound), as represented by arrows 240. This may mean that, during operation of the transducer 200, for example, during sensing, an acoustic wave (e.g., sound) 240 may be incident on the piezoelectric functional arrangement 210, where the acoustic wave 240 may then be sensed or detected.

In various embodiments, the stopper structures 206 may be pillars, concentric rings, spirals, main frames or any suitable structures, which may be arranged or positioned inside the cavity 204 and which may provide support when the support layer (or membrane) 208 undergoes a large deformation, e.g., the membrane 208 may touch the stopper structures 206.

FIG. 2C shows an example of a substrate 202, according to various embodiments, illustrating a cavity 204 defined or formed at least partially through the thickness or height of the substrate 202, and an arrangement (or plurality) of stopper structures 206 inside the cavity 204.

Figure 3A:
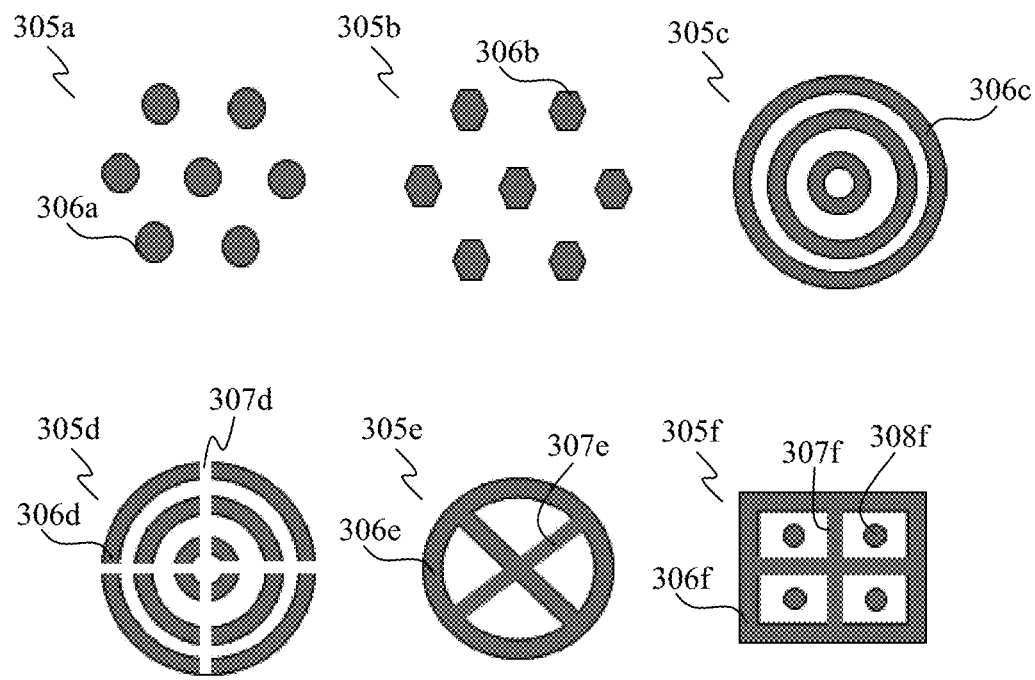
FIGS. 3A and 3B show schematic top views and cross-sectional views, respectively of some examples of stopper structures, according to various embodiments.
Figure 3B:
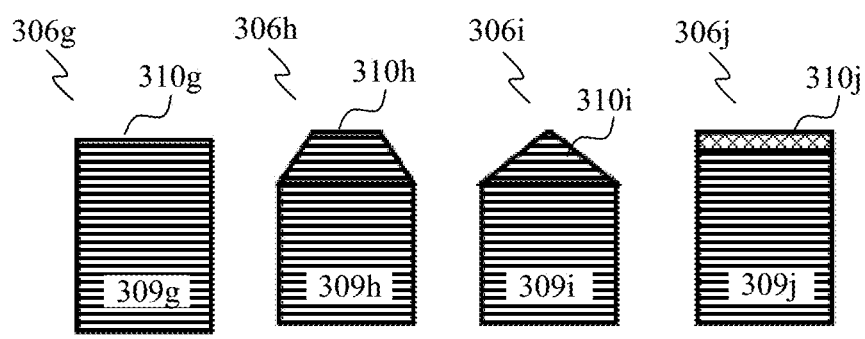

FIGS. 3A and 3B show schematic top views and cross-sectional views, respectively of some examples of stopper structures, according to various embodiments. As may be seen in FIG. 3A, an arrangement 305a of cylinders (or cylindrical pillars) 306a or an arrangement 305b of hexahedral pillars 306b may be provided. However, it should be appreciated that any polygonal-shaped pillars may be provided. Other arrangements of stopper structures may also be employed, for example, an arrangement 305c of concentric rings 306c, without any venting structure, or an arrangement 305d of concentric rings 306d with venting structures (for example, gaps, e.g., linear gaps or passages) 307d. Adjacent concentric rings 306c, 306d may be spaced apart. Further, an arrangement 305e having a ring 306e with internal structures 307e within the ring 306e may be provided. The internal structures 307e may be bar-shaped and/or may be arranged in a cross arrangement. Further, an arrangement 305f having a mainframe structure 306f, with or without supporting pillar structures 308f, may be provided. The mainframe structure 306f may include internal structures 307f, which may be bar-shaped and/or may be arranged in a cross arrangement. It should be appreciated that any number of the stopper structures may be provided in each arrangement of stopper structures. Further, it should be appreciated that the same stopper structures or different stopper structures may be provided in each arrangement of stopper structures.

As shown in FIG. 3B, a stopper structure 306g may be a cylinder 309g with a flat top surface 310g. Further, in order to further avoid stiction, each stopper structure profile may be tapered (e.g., formed by wet etching and/or dry etching) or polymer coated, such as having hydrocarbon or fluorocarbon chlorosilane-based self-assembled monolayers. For example, as shown in FIG. 3B, a stopper structure 306h having a cylindrical base 309h with a tapered top structure 310h having a flat top surface, a stopper structure 306i having a cylindrical base 309i with a tapered top structure 310i having a sharp end (e.g., a cone structure), or a stopper structure 306j having a cylindrical base 309j with a polymer coated 310j top surface may be provided.

It should be appreciated that any combination of the embodiments illustrated in FIGS. 3A and 3B may be provided for one or more stopper structures.

In various embodiments, as a non-limiting example, the arrangement of stopper structures (e.g., 206) may include cylinders with circular cross-sectional shape, and may be distributed evenly within the cavity (e.g., 204).

Figure 4A:
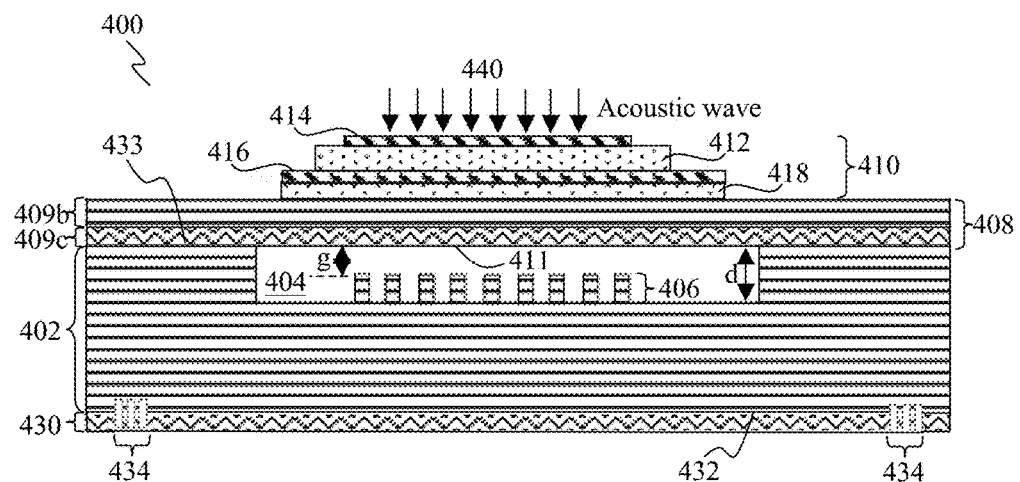
FIG. 4A shows a schematic cross-sectional view of a transducer, according to various embodiments.

FIG. 4A shows a schematic cross-sectional view of a transducer 400, according to various embodiments. The transducer 400 may include a substrate (e.g., a silicon (Si) substrate) 402, with a cavity (e.g., a backside cavity) 404, of depth, d, defined at least partially through the thickness (or height) of the substrate 402. The transducer 400 may include an array or an arrangement of stopper structures (e.g., Si stopper structures) 406 within the cavity 404. The stopper structures 406 may have at least substantially similar or identical heights. The stopper structures 406 may be individual structures and may be arranged spaced apart from each other. It should be appreciated that the arrangement of the stopper structures 406 and/or each stopper structure 406 may be as described in the context of the embodiments of FIGS. 3A and 3B. In various embodiments, each stopper structure 406 may be a cylindrical pillar.

On the back side of the transducer 400, an oxide (e.g., silicon oxide ($SiO_2$)) layer 430 may be provided to the back (or bottom) surface 432 of the substrate 402. Alignment marks 434, as will be described later below, may be defined or etched through the oxide layer 430. The alignment marks 434 may also be defined or etched partially into the substrate 402.

The transducer 400 may further include a support layer 408 arranged over the substrate 402 and the cavity 404. The support layer 408 may be arranged in contact with a front (or top) surface 433 of the substrate 402. A portion of the support layer 408 may be arranged overlapping with the cavity 404. The cavity 404 may be vacuum sealed. In the equilibrium position of the support layer 408, a distance or gap, g, may be provided between the stopper structures 406 and the bottom (or lower) surface 411 of the support layer 408, as shown in FIG. 4A.

In various embodiments, the support layer 408 may include a 2-layer arrangement, for example having a semiconductor layer (e.g., a Si layer) 409b arranged over an oxide layer (e.g., a silicon oxide ($SiO_2$) layer) 409c. The support layer 408 may additional include another oxide layer (e.g., a silicon oxide ($SiO_2$) layer (not shown) arranged over the semiconductor layer 409b.

The transducer 400 may further include a piezoelectric functional arrangement (or piezoelectric functional stack) 410 arranged over the support layer 408. The piezoelectric functional arrangement 410 may be arranged in contact with the support layer 408. The piezoelectric functional arrangement 410 may include a piezoelectric sensing (or actuating) layer (e.g., an aluminium nitride (AlN) layer) 412 sandwiched between a top (or upper) electrode 414 and a bottom (or lower) electrode 416. Each of the top electrode 414 and the bottom electrode 416 may include molybdenum (Mo). In various embodiments, the piezoelectric functional arrangement 410 may further include another piezoelectric layer (e.g., an aluminium nitride (AlN) layer) 418 in between the bottom electrode 416 and the support layer 408, where the piezoelectric layer 418 may act as a seed layer.

In various embodiments, the piezoelectric functional arrangement 410, and therefore the transducer 400, may receive an acoustic wave (e.g., sound), as represented by arrows 440. This may mean that, during operation of the transducer, for example, during sensing, an acoustic wave (e.g., sound) 440 may be incident on the piezoelectric functional arrangement 410, where the acoustic wave 440 may then be sensed or detected.

The support layer 408 may be or act as a membrane or diaphragm. At least part of the support layer 408 may be movable, e.g., a portion of the support layer 408 overlapping with the cavity 404 may be movable. The support layer 408 may be movable along an out-of-plane direction, into and/or away from the cavity 404.

Figure 4B:
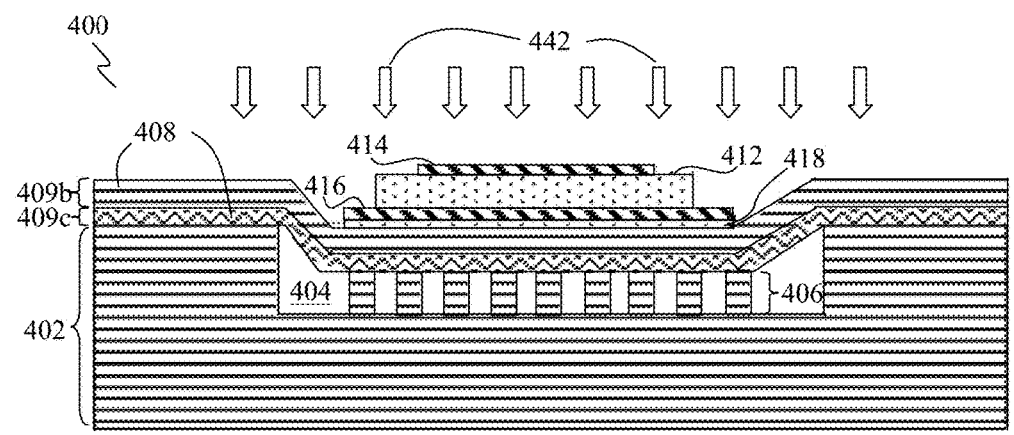
FIG. 4B shows a schematic cross-sectional view of the transducer of the embodiment of FIG. 4A, when a shock vibration or a large pressure is applied on the transducer, according to various embodiments.

In various embodiments, part of the support layer 408 may be movable, for example, as shown in FIG. 4B, when a shock vibration or a large pressure (as represented by arrows 442) is applied on or to the transducer 400, for example, applied on the support layer 408. Contact analysis shows that when a shock vibration or large pressure 442 is applied on the transducer 400, the membrane 408 may touch or come into contact with the stopper structures 406, thus avoiding breaking the membrane 408, and therefore also the transducer 400. In this way, the stopper structures 406 may provide support to the support layer (or membrane) 408 when the support layer 408 undergoes a large deformation, e.g., such that the membrane 408 may come into contact with the stopper structures 406 which may minimise or prevent any further movement or deformation of the membrane 408. Therefore, the stopper design may prevent the transducer membrane 408 breaking when going deep water or suffering from shock vibration, etc. Accordingly, the support layer (or membrane) 408 may be prevented from breaking or breaking down, e.g., becoming separated from the substrate 402 and/or failing to revert to its original or equilibrium position (which may be the state as shown in FIG. 4A).

In various embodiments, the vacuum sealed backside cavity 204, 404 may be employed to maintain a low acoustic impedance and Brownian noise. The vacuum sealed backside cavity 204, 404 may be used or may act to decrease the Brownian noise, thus providing a better noise resolution.

The stopper structure 206, 306a-306j, 406, or the arrangement of stopper structures 206, 306a-306j, 406, as protection or support structures, may be used to protect the device or transducer 200, 400, when it suffers from a high pressure such as a high hydrostatic pressure, for example, when the transducer 200, 400 goes into deep water, and/or exposed to shock vibration. Furthermore, the relative small contact area between the one or more stopper structures 206, 306a-306j, 406 and the membrane 208, 408 and/or the clean vacuum environment inside the cavity 204, 404 may efficiently minimise or avoid the stiction issue, such that the membrane 208, 408 may easily and quickly go back to its equilibrium position once the external large pressure disappears or is removed.

The distance or gap, g, from the one or more stopper structures 206, 306a-306j, 406 to the bottom surface 211, 411 of the membrane 208, 408 may be carefully designed based on the initial deformation caused by the process induced-stress and/or the vacuum level of the cavity 204, 404. The distance, g, should be large enough so that the membrane 208, 408 would not touch one or more stopper structures 206, 306a-306j when transmitting or receiving an acoustic signal 240, 440; meantime, the distance, g, should be small enough so that the membrane 208, 408 would not break once a huge pressure is applied on the membrane 208, 408. In addition, the stopper structure design may not only provide shock vibration/deep water protection, but may also allow a much larger cavity depth, d, hence enabling a longer vacuum lifetime with the same leakage. Leakage may occur, for example, when a support layer is bonded to a substrate such that a vacuum cavity is formed, and as time progresses, outside air may gradually penetrate through the bonding ring/barrier and enter the vacuum cavity, which may cause the vacuum level of the cavity to degrade.

The support layer 208, 408 may be adopted to raise the stiffness, and may control the resonant frequency (e.g., to achieve a high natural frequency), thus improving the non-linearity and sensitivity robustness. This may provide good linearity and a large dynamic range. Also, the thickness and the stiffness of the support layer 208, 408 may be much larger than those of the piezoelectric layer 212, 412, which may weaken the possible residual stress effect in the piezoelectric layer 212, 412. This may decrease the residual stress effect on the transducer performance. For one embodiment, the support layer 208, 408, may include an arrangement of $SiO_2/Si/SiO_2$. However, it should be appreciated that other suitable materials and/or other arrangements may be employed as long as it may provide an efficient mechanical support.

In various embodiments, the piezoelectric functional arrangement 210, 410 may have an arrangement or stack of electrode/piezoelectric/electrode functional (e.g., sensing and/or actuating) layer or functional (e.g., sensing and/or actuating) arrangement.

Fabrication of the transducer of various embodiments will now be described by way of the following non-limiting examples with reference to FIGS. 5A to 5G.

FIGS. 5A to 5G show, as cross-sectional views, various processing stages of a method for forming a transducer, according to various embodiments, illustrating the process flow for transducer fabrication. The fabrication process may require seven masks.

Figure 5A:
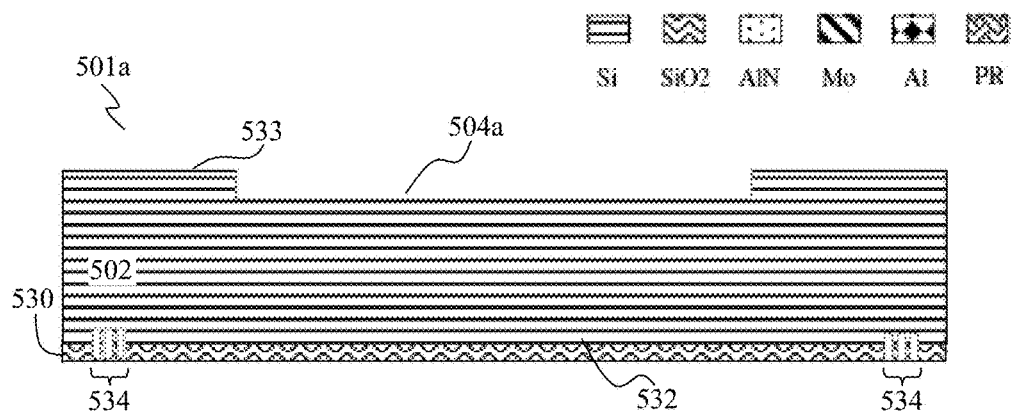
FIGS. 5A to 5G show, as cross-sectional views, various processing stages of a method for forming a transducer, according to various embodiments.

Referring to FIG. 5A, the fabrication process may start with a double-side polished wafer or substrate (e.g., silicon (Si) substrate) 502, which may include an oxide layer (e.g., silicon oxide ($SiO_2$) layer 530 on a back (or bottom) surface 532 of the substrate 502. Alignment marks 534 may be etched on the backside of the substrate 502, for example, using a first mask (Mask 1). The alignment marks 534 may be employed for process alignment purposes, for example, for support layer bonding (e.g., fusion boding) to the substrate 502 to be carried out in a subsequent step. A cavity 504a may be etched (e.g., via DRIE (deep reactive-ion etching)) on the frontside of the substrate 502 through a front (or upper) surface 533 of the substrate 502, for example, using a second mask (Mask 2). Accordingly, a structure 501a of the cavity wafer may be obtained. While not shown, a device wafer may also be fabricated, which may define a support layer.

Figure 5B:
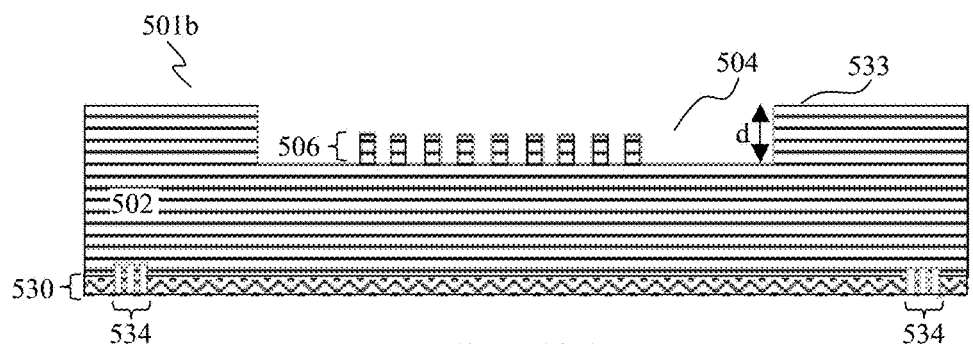

Referring to FIG. 5B, subsequently, the cavity 504a may be further etched (e.g., using DRIE (deep reactive-ion etching)) via the frontside of the substrate 502, for example, using a third mask (Mask 3) to form a cavity with a depth, d, and to form a plurality of stopper structures 506 of a silicon (Si) material. Accordingly, a structure or cavity wafer 501b may be obtained.

Figure 5C:
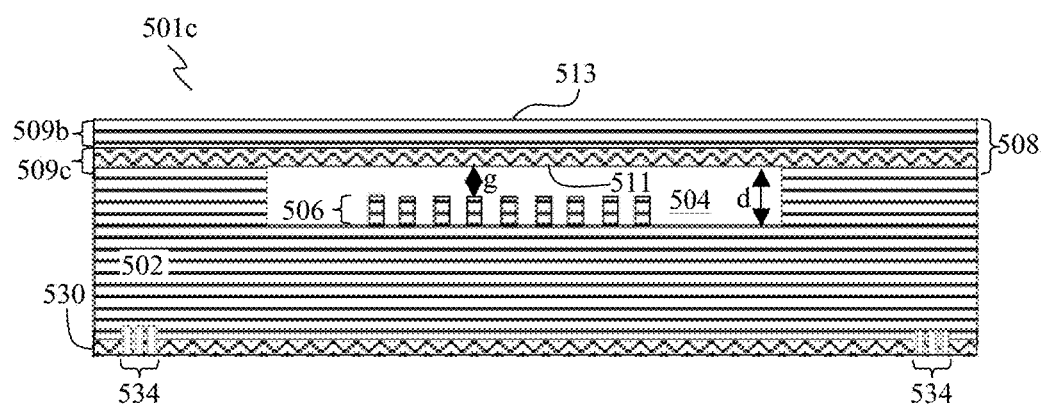

Referring to FIG. 5C, the device wafer, which defines the support layer 508, may be bonded (e.g., via fusion bonding) to the cavity wafer 501b, followed by thinning down of the device wafer to a predetermined or target thickness, so as to define a membrane thickness. For example, the support layer 508 may be bonded to the upper surface 533 of the substrate 502, and overlapping with the cavity 504. The support layer 508 may include a semiconductor (e.g., silicon (Si)) layer 509b arranged over an oxide (e.g., silicon oxide (SiO$_2$)) layer 509c. Accordingly, a structure 501c may be obtained, with a cavity depth, d, and a distance, g, defined between the top of the stopper structures 506 and the bottom (or lower) surface 511 of the support layer 508. A top surface 513 of the support layer 508 may be exposed for further processing. While not shown, the support layer 508 may further include another oxide (e.g., silicon oxide (SiO$_2$)) layer arranged over the semiconductor 509b.

Figure 5D:
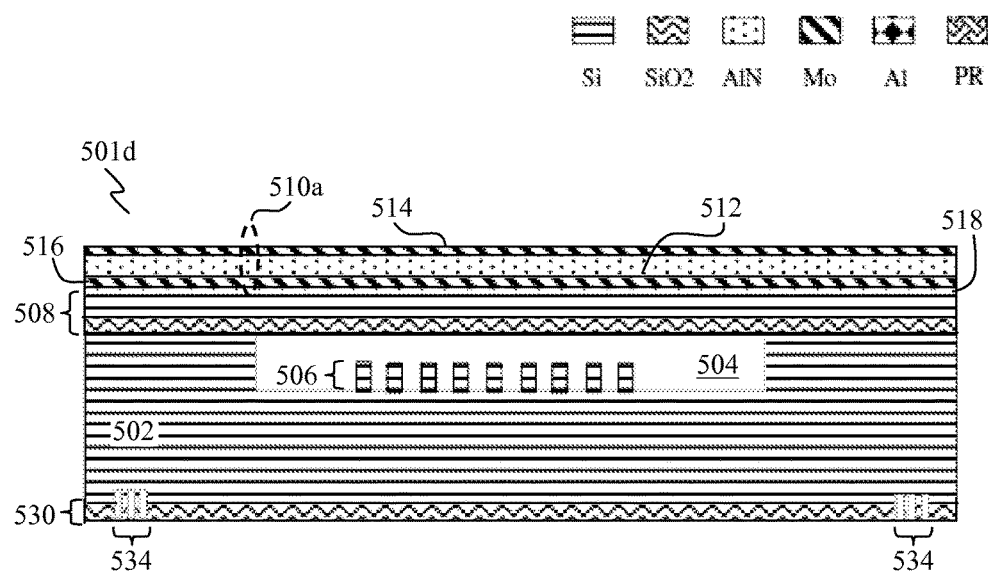

Referring to FIG. 5D, a very thin piezoelectric (e.g., aluminium nitride (AlN)) seed layer 518, a bottom electrode (e.g., having molybdenum (Mo)) 516, a piezoelectric (e.g., aluminium nitride (AlN)) layer 512 and a top electrode (e.g., having molybdenum (Mo)) 514, may be sputtered or deposited on the top surface 513 of the support layer 508 sequentially. Accordingly, a structure 501d may be obtained, having a stack or arrangement 510a of a piezoelectric seed layer 518, a bottom metal 516, a piezoelectric layer 512 and a top metal 514.

Figure 5E:
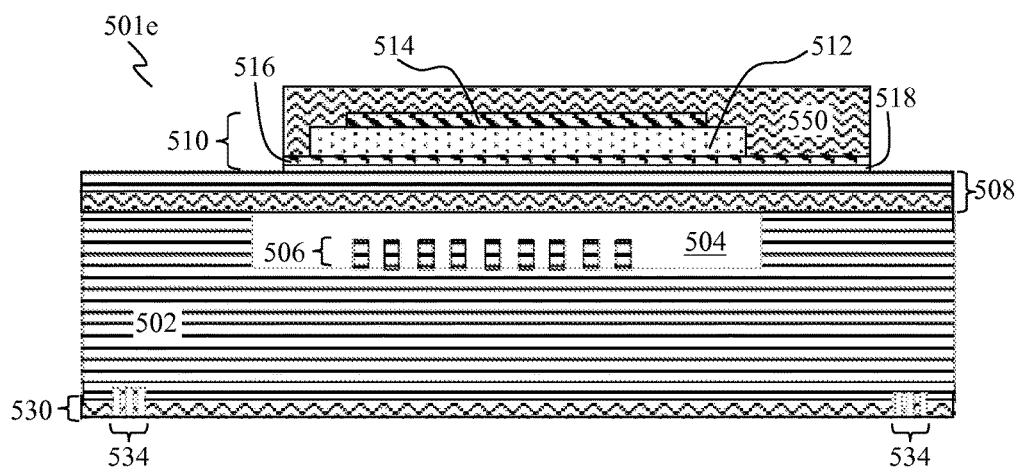

Referring to FIG. 5E, an oxide (e.g., silicon oxide (SiO$_2$)) layer 550 may be deposited over the structure 501d and patterned. Using the patterned oxide 550 as a hard mask, the top electrode 514, the piezoelectric layer 512, the bottom electrode 516 and the piezoelectric seed layer 518 may be etched, respectively, using a fourth mask (Mask 4), a fifth mask (Mask 5) and a sixth mask (Mask 6). Accordingly, a structure 501e may be obtained, where the arrangement 510a is etched to form an acoustic functional (e.g., sensing and/or actuating) stack or a piezoelectric functional (e.g., sensing and/or actuating) arrangement 510.

Figure 5F:
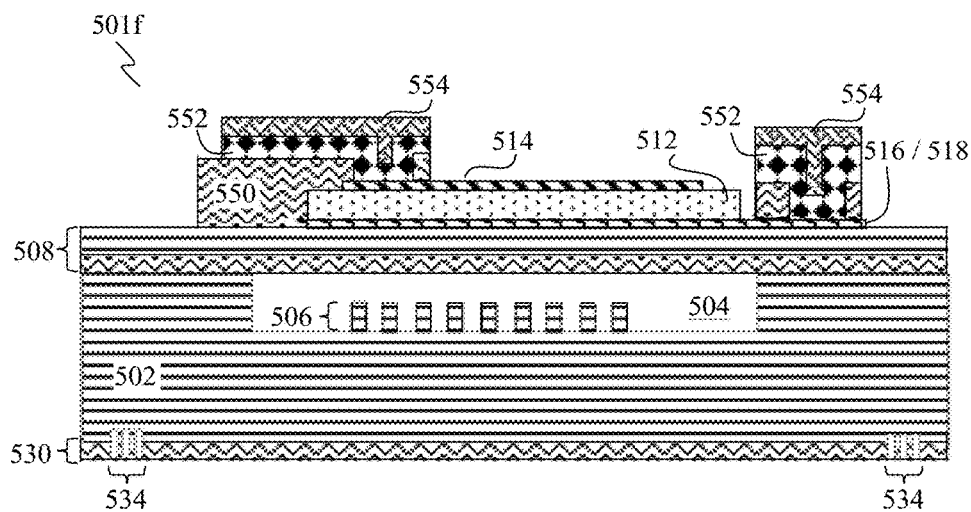

Referring to FIG. 5F, a portion of the patterned oxide 550 may then be removed, followed by metal electrode deposition and patterning to form the final electrical connections, for example, using a seventh mask (Mask 7). As a non-limiting example, a metal (e.g., aluminium (Al)) layer may be provided, followed by a photoresist (PR), which may then be patterned. Metal electrodes 552 may then be formed based on the patterned photoresist 554. Accordingly, a structure 501f may be obtained.

Figure 5G:
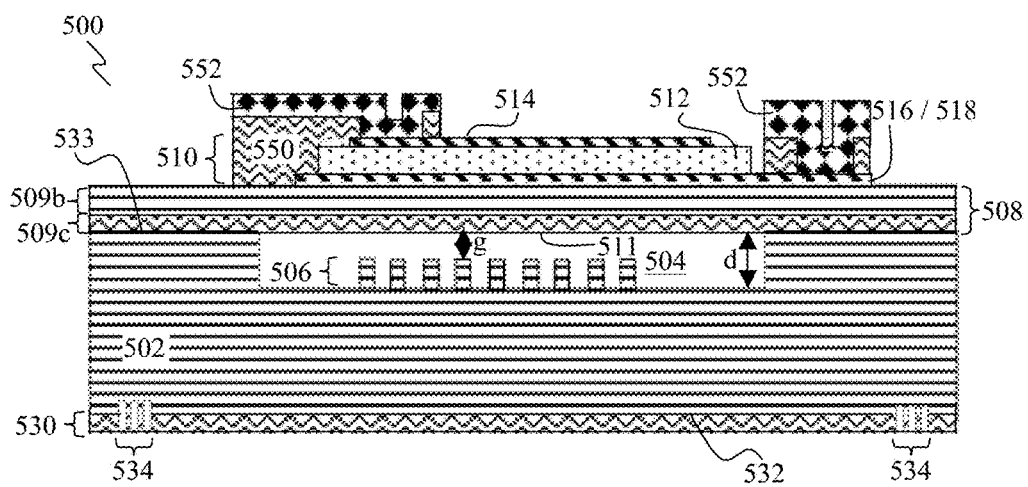

Referring to FIG. 5G, the photoresist 554 and part of the top oxide 550 may be removed, so that the final device or transducer 500 may be provided. In various embodiments, the portion of the oxide layer 509c located within the cavity 504 may be removed.

Numerical simulation of the transducer of various embodiments will now be described. A MEMS design and simulation software may be used to simulate and analyze the transducer.

Figure 6A:
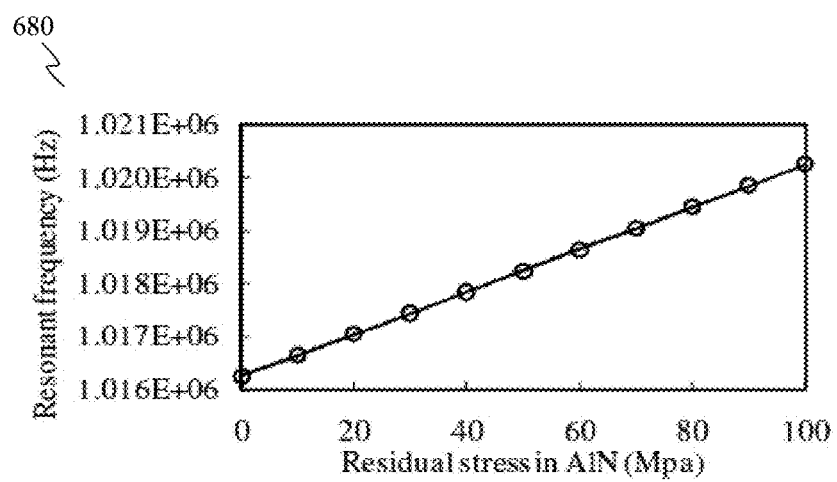
FIG. 6A shows a plot of process induced residual stress effect on the resonant frequency of the transducer, according to various embodiments.

FIG. 6A shows a plot 680 of process induced residual stress effect on the resonant frequency of the transducer, according to various embodiments. Plot 680 illustrates a linear relationship between the resonant frequency of the transducer (e.g., hydrophone) and the residual stress in the aluminum nitride (AlN) piezoelectric layer. As may be observed, the resonant frequency increases linearly as the residual stress increases, but the maximum frequency shift is only approximately 0.39% with the residual stress increasing from 0 to about 100 Mpa in the AlN sensing layer. This may imply that the residual stress in the piezoelectric layer may almost not cause a sensitivity drift because of the thick SiO$_2$/Si/SiO$_2$ support layer.

Figure 6B:
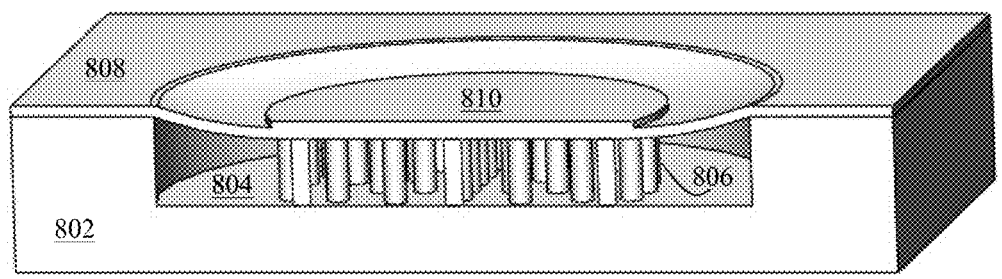
FIGS. 6B and 6C show the contact analysis results of the transducer of various embodiments, in a schematic perspective view of the transducer, with a section cut away, and in a schematic perspective view of the transducer, respectively.
Figure 6C:
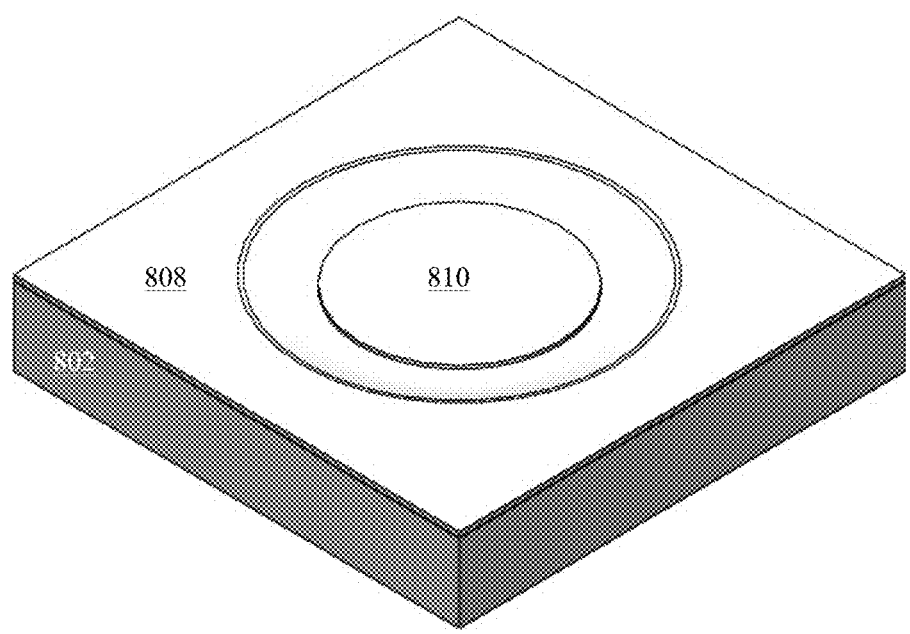

FIGS. 6B and 6C show the contact analysis results of the transducer of various embodiments, showing the contact simulation between the transducer membrane (support layer) 808, arranged to seal the cavity 804 defined in a substrate 802, and the arrangement of stopper structures (e.g., pillars) 806 within the cavity 804. Also shown is the piezoelectric functional arrangement 810 on the membrane 808. The contact analysis shows that when a shock vibration or a large pressure is applied on the transducer, the membrane 808 may deform and may then touch the stopper structures 806 to avoid breaking the membrane 808. In other words, the stopper structures 806 may play a supporter role to prevent the membrane 808 from deforming further, hence keeping the membrane 808 and the transducer safe.

Figure 6D:
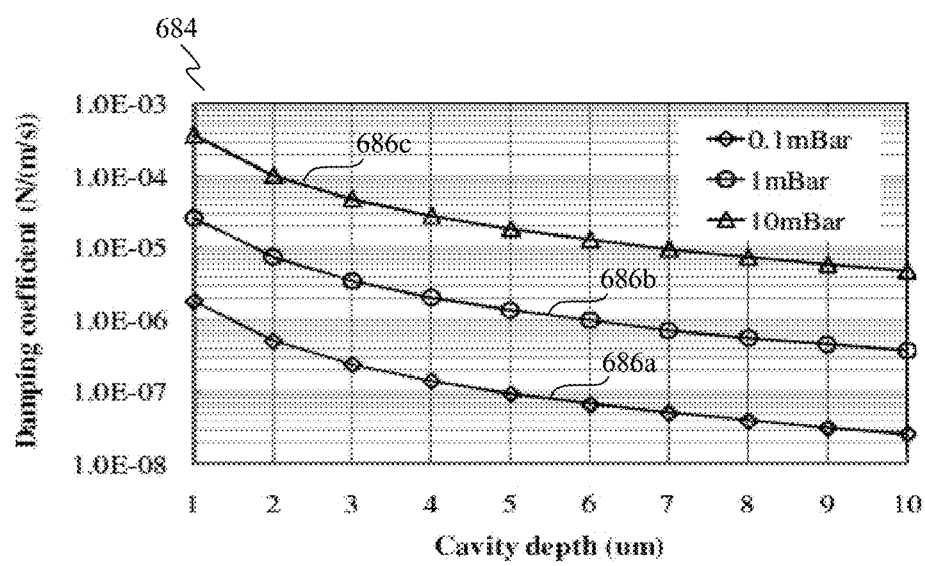
FIG. 6D shows a plot of the simulation results for the damping coefficient against the cavity depth of the transducer of various embodiments.

FIG. 6D shows a plot 684 of the simulation results for the damping coefficient against the cavity depth of the transducer of various embodiments. Plot 684 shows the damping coefficient simulation, illustrating the relationship between the damping coefficient and the backside cavity depth ranging from about 1 μm to about 10 μm, with a vacuum level of about 0.1 mBar (results 686a), about 1 mBar (results 686b), and about 10 mBar (results 686c).

As shown in FIG. 6D, the damping coefficient and the determined Brownian noise may decrease rapidly as the cavity depth increases, which may imply that not only the membrane of the transducer is protected or prevented from breaking with the stopper design of various embodiments, but also the noise performance may be improved significantly. In addition, since a large cavity depth may be designed, the bonding vacuum requirement may be relaxed and the vacuum lifetime may be extended at the same leakage. The minimum damping coefficients is approximately 2.6E-8 N/(m/s) with about 0.1 mBar packaging pressure and about 10 μm cavity depth.

The Brownian noise may be calculated accordingly by $$\text{Noise}_{MEMS} = \sqrt{4k_B TD}/S \quad \text{(Equation 1),}$$

where $k_B$ is the Boltzmann's constant and $k_B = 1.381 \times 10^{-23}$ J/K, T is temperature in K (Kelvin), D is the damping coefficient in N/(m/s), and S is the area of the transducer diaphragm (membrane) area in m$^2$.

From Equation 1, it may be observed that the Brownian noise may be affected by the damping coefficient, with the damping coefficient directly related with the vacuum value of the backside cavity and the cavity depth, which may be as shown in FIG. 6D. In various embodiments, the Brownian noise may be only approximately 3.37E-6 μBar/√Hz at about 300K.

Figure 6E:
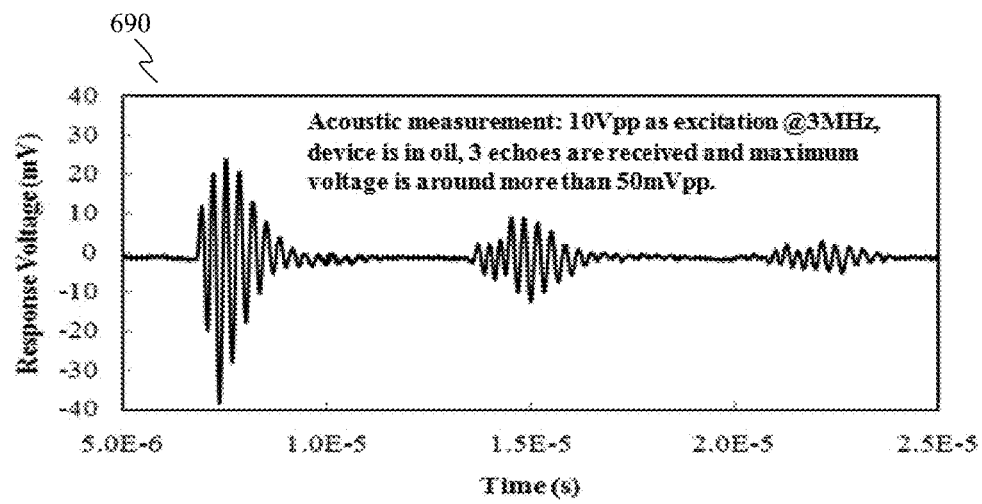
FIG. 6E shows a plot of the acoustic measurement results in soya bean oil, for the transducer of various embodiments.

FIG. 6E shows a plot 690 of the acoustic measurement results in soya bean oil, for the transducer of various embodiments, illustrating the acoustic performance measurement in soya bean oil with a 10 Vpp (peak-to-peak voltage) sinusoidal signal as the excitation signal. The device or transducer may firstly be driven using a 10 Vpp sinusoidal signal with a frequency of about 3 MHz (e.g., using an ultrasound frequency signal generating circuit electrically coupled to the piezoelectric functional arrangement of the transducer), which may generate an acoustic pressure signal; this acoustic signal may then propagate in the oil and may be reflected once it reaches the interface between oil and air; similarly the acoustic signal may be reflected again once it reaches the transducer top surface. As a result, the transducer may receive several echoes until the acoustic wave or signal dies out due to travelling attenuation. As shown in FIG. 6E, the transducer may receive about 3 echoes, with the 1st echo having more than about 50 mVpp without any amplification.

Figure 6F:
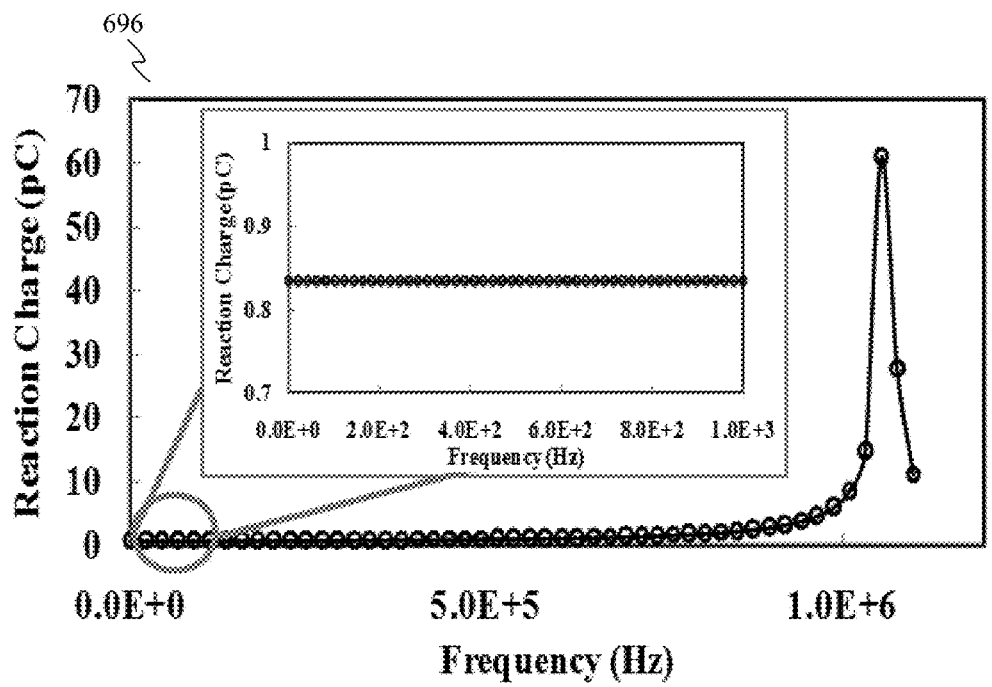
FIG. 6F shows a plot of the harmonic response with bandwidth for the transducer of various embodiments.

FIG. 6F shows a plot 696 of the harmonic response with bandwidth for the transducer of various embodiments. As may be observed in FIG. 6F, the transducer of various embodiments may have a very stable low frequency response, e.g., the sensitivity may be at least substantially constant and not changing with frequency within the range up to about 1 kHz (as may be seen from the inset in FIG. 6F). Further, even up to a frequency of about 100 kHz, the transducer may still have a flat/stable frequency response.

The transducer of various embodiments may have a sensitivity of about 10 µV/Pa at low frequency and about 700 µV/Pa at the 1st resonant frequency. Further, as described above, the residual stress caused drift may be less than about 0.39%, where the minimum Brownian noise may be only about 3.37E-6 µBar/√Hz. Approximately 20 mVpp may be received or generated with 10 Vpp excitation at a frequency of about 3 MHz. As described above, the membrane may touch the pillars once shock vibration/huge pressure is applied on the transducer.

The transducer of various embodiments may have a large storage depth, and may be at least substantially insensitive to shock vibration. The transducer may be easy to fabricate. There may be a huge market for the transducer of various embodiments, including but not limited to seafloor resource, e.g., petro, gas, mine exploration, marine biology research, and ultrasonic medical devices.

As described above, various embodiments may provide a piezoelectric MEMS acoustic transducer including or consisting of a backside cavity, at least one stopper structure (or unit) inside the cavity, a support layer and a piezoelectric stack layer.

The top view of the stopper/stopper unit may be a circle, a ring, a square, a pentagon or any other shapes (e.g., including any polygonal shapes). The stopper arrangement may be a single structure as mentioned above, or may also be an array (or plurality) of structures or multi-structure which may include or consist of the stopper structure as mentioned above. In various embodiments, the stopper surface (e.g., top surface) may be flat, sharp (such as fabricated by wet etching and/or dry etching) or with a polymer coating. The stopper or stopper structure may be fabricated by micromachining techniques, such as DRIE (deep reactive-ion etching), wet etching, polymer coating, etc.

In various embodiments, the backside cavity may be vacuum sealed, and may be fabricated by etching and wafer bonding. The support layer may include or may be any material or material combination, for example, an arrangement of $SiO_2$/Si. The piezoelectric sensing layer may include or consist of a piezoelectric material sandwiched between two metal layers. The piezoelectric layer may include but not limited to aluminum nitride (AlN), quartz, lithium niobate ($LiNbO_3$), lithium tantalate ($LiTaO_3$) or any other suitable piezoelectric material (e.g., zinc oxide (ZnO), cadmium sulfide (CdS), lead titanate ($PbTiO_3$), lead zirconate titanate (PZT), potassium niobate ($KNbO_3$), lithium borate ($Li_2B_4O_7$), langasite ($La_3Ga_5SiO_{14}$), gallium arsenside (GaAs), barium sodium niobate, bismuth germanium oxide (BGO), indium arsenide (InAs), and indium antimonide (InSb)).

As described above, a piezoelectric MEMS transducer with a stopper protection structure and a vacuum sealed backside cavity, a support layer and a charge sensing mechanism has been designed and simulated. The stopper structure may not only protect the transducer from shock vibration and/or large pressure, but also allow a deep cavity design, which may significantly reduce the Brownian noise of the transducer. The simulation results show a good low frequency response, a very low residual stress effect and Brownian noise and an excellent linearity within a large dynamic range from 0 to about 0.25 Bar.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A transducer comprising:
   a substrate, wherein a cavity is defined at least partially through the substrate;
   at least one stopper structure arranged within the cavity;
   a support layer arranged over the at least one stopper structure and the cavity to seal the cavity; and
   a piezoelectric functional arrangement arranged on the support layer;
   wherein the substrate comprises a semiconductor;
   wherein the at least one stopper structure comprises a semiconductor base comprising the semiconductor, and a polymer coat on the semiconductor base; and
   wherein the support structure is an arrangement of a first oxide layer, a semiconductor layer on the first oxide layer, and a second oxide layer on the semiconductor layer so that the first oxide layer comes into contact with the stopper structure upon the support layer undergoing deformation.

2. The transducer as claimed in claim 1, wherein the support layer is arranged directly on the substrate.

3. The transducer as claimed in claim 1, wherein the piezoelectric functional arrangement is arranged directly on the support layer.

4. The transducer as claimed in claim 1, wherein the at least one stopper structure extends from a base surface of the cavity.

5. The transducer as claimed in claim 1, wherein the at least one stopper structure comprises an elongate structure.

6. The transducer as claimed in claim 1, wherein the at least one stopper structure comprises a ring structure.

7. The transducer as claimed in claim 1, wherein the at least one stopper structure comprises a tapered top region.

8. The transducer as claimed in claim 1, wherein the transducer comprises a plurality of stopper structures arranged within the cavity.

9. The transducer as claimed in claim 8, wherein the plurality of stopper structures are arranged in at least one concentric pattern.

10. The transducer as claimed in claim 8, wherein adjacent stopper structures of the plurality of stopper structures are arranged spaced apart from each other.

11. The transducer as claimed in claim 1, wherein the piezoelectric functional arrangement comprises a pair of electrodes and a piezoelectric element arranged in between the pair of electrodes.

12. The transducer as claimed in claim 1, further comprising an ultrasound frequency signal generating circuit electrically coupled to the piezoelectric functional arrangement.

13. The transducer as claimed in claim 1, further comprising an acoustic signal detector.

14. The transducer as claimed in claim 1, wherein a depth of the cavity is larger than about 1 µm.

15. The transducer as claimed in claim 1, wherein in an equilibrium position, a distance between a top surface of the at least one stopper structure and a lower surface of the support layer is between about 0.2 µm and about 10 µm.

16. The transducer as claimed in claim 1, wherein the cavity is at least substantially vacuum sealed.

17. A method for forming a transducer, the method comprising:
    forming a cavity at least partially through a substrate;
    forming at least one stopper structure within the cavity;
    forming a support layer over the at least one stopper structure and the cavity to seal the cavity; and
    forming a piezoelectric functional arrangement on the support layer;
    wherein the substrate comprises a semiconductor;
    wherein the at least one stopper structure comprises a semiconductor base comprising the semiconductor, and a polymer coat on the semiconductor base; and
    wherein the support structure is an arrangement of a first oxide layer, a semiconductor layer on the first oxide layer, and a second oxide layer on the semiconductor layer so that the first oxide layer comes into contact with the stopper structure upon the support layer undergoing deformation.

\* \* \* \* \*